US009165745B2

(12) United States Patent
Luo

(10) Patent No.: US 9,165,745 B2
(45) Date of Patent: Oct. 20, 2015

(54) PERMANENT MAGNET BASED HIGH PERFORMANCE MULTI-AXIS IMMERSION ELECTRON LENS ARRAY WITH LOW AXIAL LEAKAGE FIELD

(71) Applicant: Tao Luo, Edgefield Plains (SG)

(72) Inventor: Tao Luo, Edgefield Plains (SG)

(73) Assignee: Maglen Pte Ltd, Edgefield Plains (SG)

( * ) Notice: Subject to any disclaimer, the term of this patent is extended or adjusted under 35 U.S.C. 154(b) by 0 days.

(21) Appl. No.: 14/196,190

(22) Filed: Mar. 4, 2014

(65) Prior Publication Data

US 2014/0326895 A1 Nov. 6, 2014

Related U.S. Application Data

(60) Provisional application No. 61/775,656, filed on Mar. 10, 2013.

(51) Int. Cl.
| | | |
|---|---|---|
| *H01J 37/145* | (2006.01) | |
| *H01J 37/14* | (2006.01) | |
| *H01J 37/143* | (2006.01) | |
| *H01J 3/20* | (2006.01) | |

(52) U.S. Cl.
CPC . *H01J 37/14* (2013.01); *H01J 3/20* (2013.01); *H01J 37/143* (2013.01); *H01J 37/145* (2013.01); *H01J 2237/1405* (2013.01)

(58) Field of Classification Search
USPC .................................................. 250/396 ML
See application file for complete search history.

(56) References Cited

U.S. PATENT DOCUMENTS

| 6,731,446 | B2 * | 5/2004 | Ikeda et al. ...................... 360/59 |
|---|---|---|---|
| 7,928,377 | B2 * | 4/2011 | Ishitani et al. ................. 250/306 |
| 2004/0211914 | A1 * | 10/2004 | Buijsse ......................... 250/398 |
| 2008/0067396 | A1 | 3/2008 | Ohshima et al. |
| 2008/0315090 | A1 * | 12/2008 | Nakasuji et al. ............... 250/306 |
| 2010/0019648 | A1 * | 1/2010 | Yasuda et al. ................. 313/412 |
| 2011/0215243 | A1 * | 9/2011 | Ezumi et al. .................. 250/307 |

FOREIGN PATENT DOCUMENTS

| DE | 892036 | 10/1952 |
|---|---|---|
| DE | 1035813 | 8/1958 |

OTHER PUBLICATIONS

International Search Report, PCT Application No. PCT / SG 2014/000102, mailed on Apr. 29, 2014.
Written Opinion of the International Searching Authority, PCT / SG 2014/000102, Apr. 29, 2014.

\* cited by examiner

*Primary Examiner* — Phillip A Johnston
*Assistant Examiner* — Hsien Tsai
(74) *Attorney, Agent, or Firm* — FSP LLC

(57) ABSTRACT

An apparatus includes a magnetic adjustment lens positioned at the electron beam path between the electron source and sample, the magnetic adjustment lens excited by an electric coil, and a permanent magnet lens positioned below the magnetic adjustment lens to focus the electron beam onto the sample surface, the permanent magnet lens excited by one or more permanent ring magnets enclosed except on a bottom surface by a magnetic field conductor. The magnetic adjustment lens may be excited to eliminate magnetic field leakage of the permanent magnet lens.

18 Claims, 8 Drawing Sheets

PERMANENT MAGNET BASED HIGH PERFORMANCE MULTI-AXIS IMMERSION ELECTRON LENS ARRAY WITH LOW AXIAL LEAKAGE FIELD

PRIORITY CLAIM

The present application claims priority under 35 U.S.C. 119 to U.S. application Ser. No. 61/775,656, filed on 10 Mar. 2013, which is incorporated herein by reference in its entirety.

BACKGROUND

Defects in integrated circuit chips may arise during a patterned wafer fabrication process. Defect information may be obtained from wafer inspection tools to improve production yield. Two types of defect detection tools are commonly used: (1) optical inspection tools, which illuminate a wafer using optical light, and (2) scanning electron beam inspection tools, which illuminate a wafer using electrons.

Optical inspection systems provide throughput on the order of a few hours for a 300 mm wafer inspection task, utilizing parallel data acquisition. However, the resolution of optical inspection tools is restricted by the diffraction limit imposed by the (relative to electrons) large wavelength of photons. Currently, optical inspection systems are not able to identify all of the defects at fourteen nanometer and smaller design scales.

The diffraction limit imposed by scanning electron beam inspection tools is significantly lower than that of optical tools because the wavelength of electrons is on the order of angstroms. Scanning electron beam inspection tools provide resolution on the order of a few nanometers, which is enough resolution to detect defects at fourteen nanometer and lower patterned wafer design scales. Unfortunately, the throughput of scanning electron beam inspection tools is low because imaging data is obtained in a serial manner during the scanning process. Depending on the signal-to-noise ratio required for the inspection process, the data acquisition rate of scanning electron beam inspection tools is commonly from 100 mega pixels to about one giga pixel per second. Currently, it takes more than a week to inspect a 300 mm wafer with a ten nanometer pixel size using a conventional scanning electron beam inspection system.

A multiple electron beam inspection system utilizing parallel data acquisition may increase the throughput and shorten the time to inspect a wafer. One parallel approach utilizes a common electric current coil to generate magnetic excitations at an array of holes on a magnetic pole piece, creating an array of magnetic electron focusing lenses. The current coil has only one axis of symmetry, which means that only one lens in the array can be excited symmetrically. The other lenses are excited asymmetrically because the lens optical axis does not overlap with the geometric axis of the excitation coil. This symmetry mismatch causes magnetic field distortion along the optical axis, degrades resolution, and introduces non-uniform performance among different lenses. Another approach creates a small current-driven electron magnetic focusing lens unit, and assembles an array of such lens units together. The lens excitation is limited by the current density in a limited space; resolution of the lens is limited as a result. Yet another approach utilizes non-shielded permanent magnets and shared magnetic conductors to create a focusing lens array. All of these prior approaches either have two focusing lens fields, complicating deflection and detection system design, or they exhibit a strong leakage field along the optical axis, which degrades resolution and field of view.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
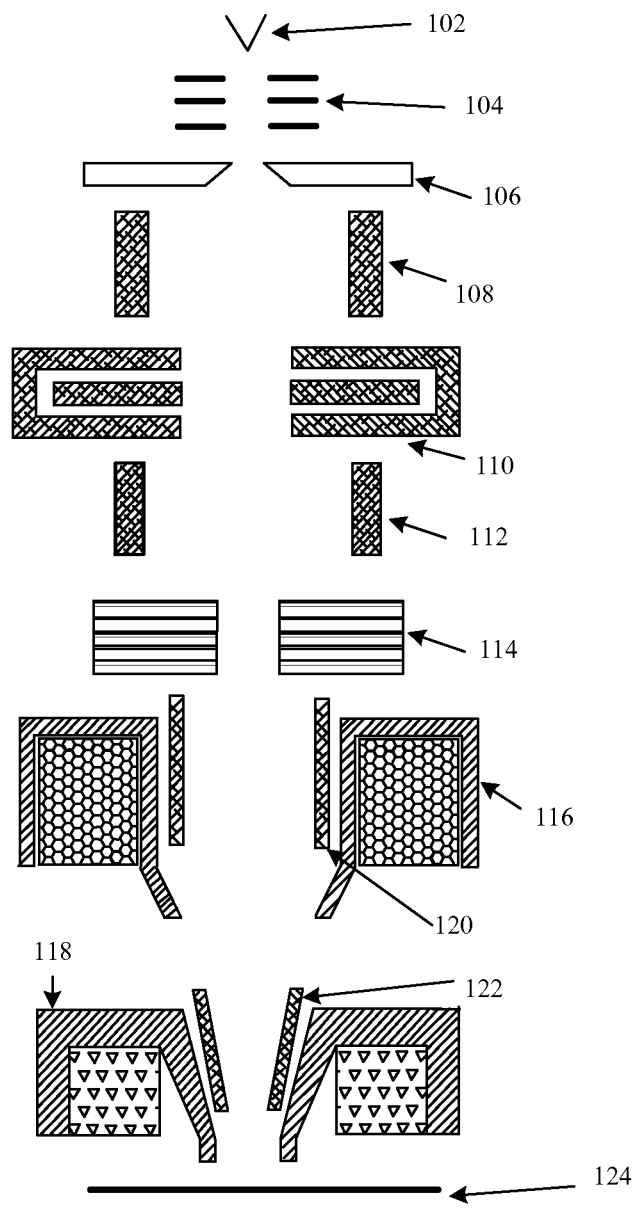
FIG. 1 illustrates an embodiment of a scanning electron beam column, including a combined magnetic and electrostatic immersion lens system, which includes a permanent magnet lens and a magnetic adjustment lens.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

Overview

In one embodiment, four lenses are arranged in a column. The column comprises the following components, from top (electron source) to bottom (sample to be scanned): (1) a gun lens, which controls the beam current passing through an aperture, (2) an electrostatic adjustment lens, which provides numerical aperture adjustment for the beam, (3) a magnetic adjustment lens, which eliminates a leakage field of a permanent magnet (objective) lens below it, and (4) a permanent magnet lens, which forms a strong immersion magnetic field at the sample surface. Fine focusing control on the sample surface is achieved by controlling a voltage bias of the permanent magnet lens.

A ring shaped permanent magnet and a magnetic conducting enclosure form a modularized electron beam focusing lens assembly, which applies a combined electrostatic and magnetic immersion field to focus the electron beam. The ring magnet is enclosed by a high permeability material which acts as a magnetic field conductor. The geometry of the assembly of the magnet and magnetic conductor forms a strong magnetic field as part of the final focusing lens in an electron beam column. A sample may be immersed in a field generated under the lens for improved resolution and field of view. A weaker magnetic adjustment magnetic lens, driven by a coil, may be placed above (closer to the electron beam source) the permanent magnet lens, so that the leakage field above the permanent magnet lens can be substantially eliminated in order to obtain the best focus and field of view. The coil-excited magnet is enclosed by a high permeability material which acts as a magnetic field conductor. The coil excitation of the adjustment magnetic lens forms a magnetic field between the adjustment magnetic lens and the permanent magnet lens, cancelling the leakage field between these two lenses. The adjustment magnetic lens may also be used for some applications to keep the electron beam focused at the sample surface under varying beam conditions (e.g., landing energy and extraction field). This unusual approach involves compromising some leakage field cancellation to gain some focus control. A third electrostatic lens may be utilized in the column to change numerical aperture and depth of focus of the focused electron beam on sample surface. The electrostatic gun lens may be used to control the beam current passing the beam forming aperture in the column.

This design is counter-intuitive in view of conventional approaches. Magnetic field excitations from electrical coils are avoided in the permanent magnet lens. Conventionally, this means the permanent magnet lens' focal length and working distance cannot be controlled by varying a current through the lens coil. However, the following description will explain and provide examples of how this may be overcome. Another unconventional feature is that the focus of the permanent magnet lens can be adjusted by changing the voltage of the permanent magnet lens. The focus of permanent magnet lens can also be changed by changing the excitation of the coil-driven adjustment lens, or changing the excitation of the electrostatic adjustment lens. It may seem counterintuitive to incorporate these multiple manners of adjusting the focus of a permanent magnet lens in a single column, however, unexpected advantages emerge which are described in the following description. The electrostatic adjustment lens can also be used to change the numerical aperture and depth of focus of the focused electron beam at the sample surface. Again it may be unconventional and counterintuitive to design and apply the electrostatic adjustment lens for all these purposes (focus of permanent magnet lens, adjustment of numerical aperture and depth of focus), however, unexpected advantages emerge. Yet another unconventional feature is utilizing a coil-driven magnetic adjustment lens in close proximity to the permanent magnet lens to eliminate leakage field. Yet another unconventional feature is that the permanent magnet lens is constructed to cause a magnetic field to protrude below the lens, and the sample is not immersed within a cavity of the lens. The permanent magnet lens is also formed to have a low leakage field, while concentrating magnetic flux toward the central axis and below the lens.

A scanning process utilizing an electron beam may be performed using either a double deflection or triple deflection column. In a double deflection column, all defectors are operated at close to ground potential, and no high voltage isolation is utilized. A triple deflection column has an additional (final) deflector system as well as a stigmator, situated between the permanent magnet lens and the magnetic adjustment lens. A triple deflection system has a superior field of view because the first two deflectors scan through the center of the magnetic adjustment lens to minimize off axis aberration, and the third scan deflector scans through the center of the permanent magnet lens.

In both column types, the final scan generator system may compose an octu-pole, or a duodeca-pole electrostatic deflector, which also acts as a stigmator. Each individual and modularized column of the double deflector type may include an electron source 102 to generate electrons, a gun lens 104 to control the electron beam current passing through the electron beam forming aperture, an electron beam forming aperture 106 to form the electron beam, an electrostatic adjustment lens alignment deflector 108 to align the electron beam to the electrostatic adjustment lens, an electrostatic adjustment lens 110 to control numerical aperture of the focused electron beam on sample surface, a first stage scan generation deflector 112 (which may comprise an electrostatic octu-pole or duodeca-pole deflector), an electron detector 114 to detect scattered electrons from the sample surface, a second stage scan generation deflector/stigmator 120 (which may comprise an electrostatic octu-pole or duodeca-pole deflector), a magnetic adjustment lens 116 to eliminate a leakage field of the permanent magnet lens, and a permanent magnet lens 118 to generate a strong magnetic immersion field. The permanent magnet lens 118 is an immersion lens with combined magnetic and electrical fields. A triple deflection column includes a third stage scan generation deflector/stigmator, which may comprise an octu-pole, or a duodeca-pole electrostatic deflector between the magnetic adjustment lens and the permanent magnet lens, which also operates as a final stigmator.

Details of Example Embodiments

FIG. 1 illustrates an embodiment of a modularized scanning electron beam column, including an electron source 102, a gun lens 104, an electron beam forming aperture 106, an electrostatic adjustment lens alignment deflector 108, an electrostatic adjustment lens 110, a first stage scan generation deflector 112, an electron detector 114, a second stage scan generation deflector/stigmator 120, a magnetic adjustment lens 116, and a permanent magnet lens 118. An electron source 102 generates electrons which are electrically controlled and formed into a beam by a gun lens 104 and beam forming aperture 106. The electron beam is deflected as it passes through a number of intermediate elements (described shortly). The electron beam then enters a combined magnetic and electrostatic field of a permanent magnet lens 118 which focuses the beam onto a sample 124 to scan. Electrons which are emitted back from the sample 124 impact a detector 114 which reacts by producing a signal indicative of sample features. This signal may be processed in known ways to identify defects in the formation of the sample.

A number of intermediate elements may act upon the electron beam before it reaches the permanent magnet lens 118. A pair of scan deflectors 112,120 may cooperatively scan the beam at a center of the permanent magnet lens 118 (double deflection) or at a center of a focus adjustment lens 116 (triple deflection). In triple-deflection implementations, a third deflector 122 may be utilized to scan the beam at the center of the permanent magnet lens 118.

For superior resolution, the magnetic adjustment lens is excited to eliminate a leakage field of the permanent magnet lens. The permanent magnet lens 118 has a single focusing field, and the electron beam has no pre-sample beam focus cross-over. This simplifies the design of deflection and detection systems utilizing the beam column, reduces electron-electron interaction, and improves resolution at high beam currents. The permanent magnet lens 118 may be assembled from only two components, improving column density in array layouts, and thus increasing the parallel data acquisition rate.

A coil driven magnetic adjustment lens 116 may be utilized in various ways to improve the performance of the column. The adjustment lens may be utilized in some applications to adjust the focus to compensate for machining errors. The adjustment lens 116 may also be utilized to compensate for beam condition variations, such as variations in the beam landing energy and extraction field. The adjustment lens 116 may be located proximate (e.g., within 10 mm) to the permanent magnet lens 118, and may generate overlapping electrostatic (E) and magnetic (M) fields to reduce aberration. A two lens system (a permanent magnet lens 118 and a magnetic adjustment lens 116) creates a single strong combined magnetic and electrostatic immersion field lens with minimized magnetic leakage field.

Some implementations may utilize an electrostatic adjustment assembly comprising a deflector 108 and electrostatic lens 110. The electrostatic adjustment assembly may be located above the focus adjustment assembly (116,120). When larger depth of focus on the sample surface 124 is needed, this assembly may operate electro-statically to increase the depth of focus of the focused electron beam on the sample surface.

Each permanent magnet lens element in the column has a local (to the lens) axial symmetric side shielding magnetic conductor, which mitigates leakage magnetic field in the optical axis between electron source 102 and permanent magnet lens 118. This improves image resolution and field of view.

The magnetic field of each permanent magnet lens and each magnetic adjustment lens in a column is excited independently of the lenses in other columns, so that there is no shared common excitation coil between columns. This mitigates symmetry mismatches resulting from a common excitation source and off-center lens field distribution. The magnetic conductor for each lens may fully enclose the lens magnet, except from the bottom, so that the leakage field above the lens is reduced and the field at the bottom is enhanced. The magnetic adjustment lens 116 may be operated to concentrate axial leakage fields between the bottom of adjustment lens 116 and top of the permanent magnet lens 118. This leakage field can be substantially eliminated by coil excitation.

The permanent magnet lens 118 may be constructed to have a low profile so that it may be located close to the sample, reducing the working distance from the sample and improving resolution. The permanent magnet lens 118 may have combined magnetic fields and electrostatic fields, reducing aberration.

Each lens and other components may be independently constructed and then assembled together subsequently into a modularized and independent scan column. Any mechanical misalignments can be calibrated and corrected during the assembly process. The columns may be assembled into groups ('arrays') with an inter-column spacing only slightly larger than the dimension of the widest element in the column.

A single column may operate as a single column electron beam inspection system with very high resolution and low thermal power dissipation.

Either a double or triple deflection column may be constructed from (1) a magnetic adjustment lens positioned and excited to cancel the leakage field from the permanent magnet lens, and (2) a permanent magnet lens positioned to focus the electron beam onto the sample. The permanent magnet lens is excited by one or more permanent ring magnets enclosed except on a bottom by a magnetic field conductor. By "enclosed" it is meant that the magnetic field conductor lies within the magnetic field associated with a particular side of the magnet.

The magnetic adjustment lens and the permanent magnet lens may be configured without intervening electrical isolation of the scanning deflector (e.g., double deflection), or the magnetic adjustment lens and the permanent magnet lens may be configured with intervening high-voltage electrical isolation of the scanning deflector (e.g., triple deflection).

Figure 2:
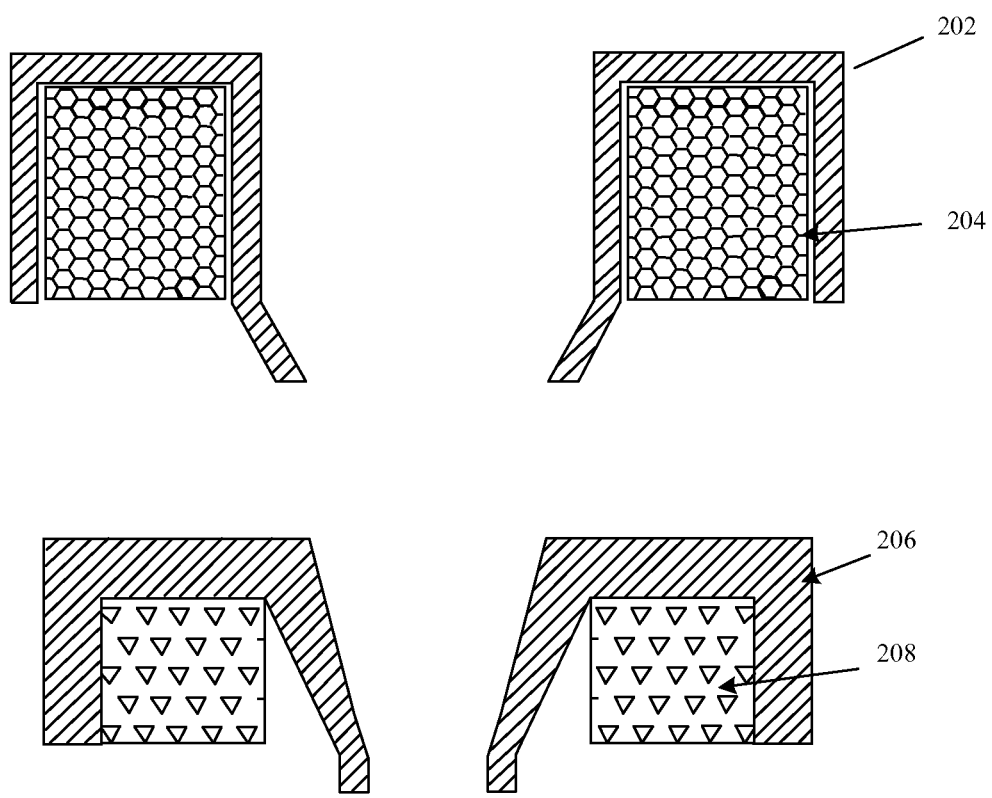
FIG. 2 illustrates an embodiment of an objective lens system, which includes a permanent magnet lens and a magnetic adjustment lens.

FIG. 2 illustrates an embodiment of a permanent magnet lens and a magnetic adjustment lens. The magnetic adjustment lens includes a magnetic conductor 202 and a coil 204 to induce a magnetic field inside the magnetic conductor 202. The coil 204 and conductor 202 are electrically isolated from one another. The conductor 202 gives shape to the magnetic field induced by the coil 204, providing a cancellation of the leakage magnetic field of the permanent magnet lens by controlling an electric current in the coil 204.

The permanent magnet lens 118 includes a magnetic conductor 206 and a ring magnet 208 (e.g., rare earth permanent magnet) having an axial magnetic excitation. The ring magnet 208 induces a magnetic field inside the magnetic conductor 206. Use of the permanent magnet 208 can eliminate electrical isolation in the permanent magnet lens 118. The conductor 206 gives shape to the magnetic field distribution induced by the magnet 208.

Figure 3:
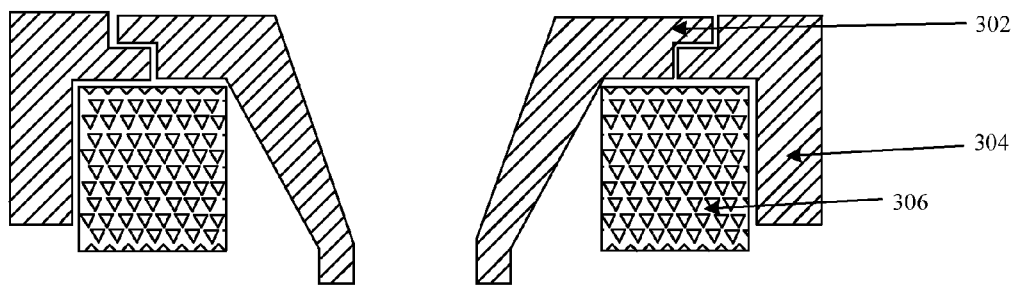
FIGS. 3A, 3B, and 3C illustrate embodiments of a permanent magnet lens.
Figure 3:
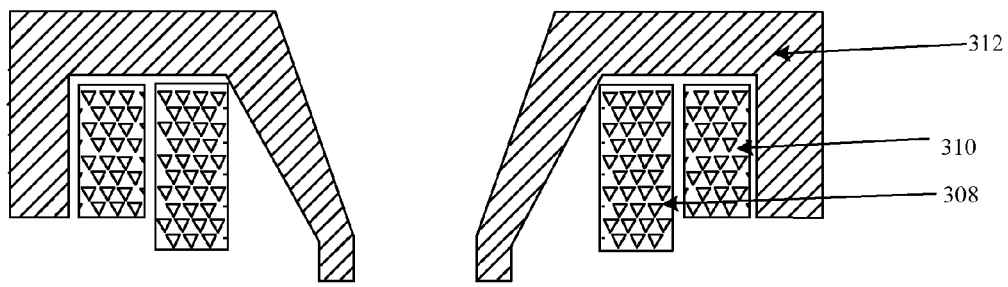
Figure 3:
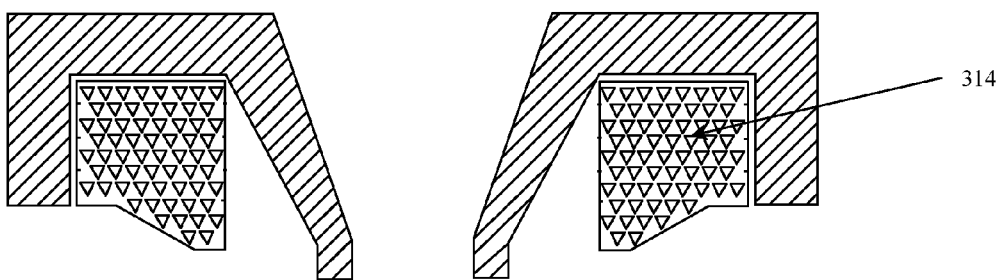

FIGS. 3A, 3B, and 3C illustrate embodiments of a permanent magnet lens. One embodiment (FIG. 3A) includes a single ring magnet 306 and two magnetic conductors (302, 304). One conductor 302 has a high magnetic permeability; a second conductor 304 has a medium or high permeability. By way of example, the high permeability magnetic material has a relative permeability of approximately 10000 ($u/u_0$). Medium permeability material of the typical permeability between 5000 to 8000 ($u/u_0$). This arrangement creates a relative low magnetic conductive resistance in the center of the magnetic polepiece, allowing more magnetic flux to propagate from the center of the permanent magnet lens. This increases the magnetic field at the center of the permanent magnet lens, making the lens stronger and increasing resolution.

Another embodiment (FIG. 3B) utilizes a single magnetic conductor 312 and two concentric ring magnets 308,310. The magnetic excitation of the magnets 308,310 may be different or the same; the cross sections of the magnets 308,310 may differ. The inner magnet 308 has a greater height, therefore higher magnetic excitation, creating a higher central magnetic field and stronger lens, improving resolution. The outer magnet 310 is shorter in height, so that the leakage field is smaller and easier to eliminate. The magnets 308,310 may be comprised of the same material, with an excitation determined by the height of the material along the magnetization direction.

Another embodiment (FIG. 3C) includes a single magnet 314 having a non-rectangular cross section, again shaped to improve lens performance. In each embodiment the excitations of the magnets are axial. Each design concentrates the magnetic field along the center axis of the lens, while reducing the outer leakage field.

In some embodiments (e.g., FIG. 2 and FIG. 3C) the permanent magnet lens may be constructed of two elements, a single ring permanent magnet and a magnetic conducting material. The simplicity of this permanent magnet lens structure enables a compact design suitable for high density array assemblies, increasing inspection throughput. The permanent magnet lens does not utilize external electrical current components and may be biased to high voltages. There is no magnetic coil in the permanent magnet lens so that high voltage isolation within the permanent magnet lens is not required.

The leakage field above the permanent magnet lens can be canceled by the magnetic adjustment lens, enabling the permanent magnet lens to operate at optimized conditions. The sample may be biased to a high voltage (e.g., −11000V), and the permanent magnet lens biased at another high voltage (e.g., −9000V), creating an electric retarding field between them. Electron lenses can only focus, not defocus. If an adjustment lens is positioned above the permanent magnet lens, it can only move the focus closer to the permanent magnet lens and further from the sample. During a scan, variations in the sample surface height may result in a smaller or larger distance between the sample surface and the permanent magnet lens. It is thus desirable to be able to increase and decrease the focusing power of the column. This may be achieved by changing the high voltage bias of the permanent magnet lens, which effectively changes the energy of the electron beam entering the magnetic field below the permanent magnet lens. This magnetic field below the permanent magnet is constant. A higher voltage bias on the permanent magnet lens creates a higher power beam with less focusing effect, and a lower voltage bias on the permanent magnet lens creates a lower power beam with more focusing effect.

The magnetic conductor in the permanent magnet lens may be constructed of two different materials, as in FIG. 3A, to enhance the axial field distribution and improve image resolution. The shape of the magnetic conductor may be adjusted to optimize for a given application as in FIG. 3C. The ring magnet may be split into two or more rings to enhance the axial symmetry of the lens as in FIG. 3A. The lens' magnetic conductor fully encloses the ring magnet, except on the bottom (toward the sample side), so that the leakage field above the lens is mitigated, and the field at the bottom is enhanced. Focusing field interference between each of the lenses is also mitigated by this approach.

Thus in one embodiment, one or more permanent ring magnets of the permanent magnet lens can include a first ring magnet having a first height and a first diameter, and a second ring magnet having a second height and a second diameter, the first and second ring magnets being concentric around a central axis of the permanent magnet lens, the first height greater than the second height, the first diameter less than the second diameter. "Height" in this context refers to the "top-to-bottom" width of the magnet, i.e. its width along the central axis. "Diameter" in this context refers to the magnet's diameter as measured from a center at the central axis.

In another embodiment, the magnetic field conductor of the permanent magnet lens can include a first material having a first magnetic permeability, and a second material having a second magnetic permeability, the first magnetic permeability greater than the second magnetic permeability, the first material located to shield at least a part of a top and all of an inner area of the one or more permanent ring magnets, and second material located to shield at least a part of the top and all of an outer area of the one or more permanent ring magnets. An "inner area" refers to an area of the magnet closest to the central axis; a "top area" refers to an area of the magnet closest to the beam source. An "outer area" refers to an area of the magnet furthest (diametrically) from the central axis. A "bottom area" refers to an area of the magnet closest to where a sample is located for analysis.

In another embodiment, the one or more permanent ring magnets of the permanent magnet lens have a cross section height that is greater at an inner diameter of the one or more permanent ring magnets than at an outer diameter of the one or more permanent ring magnets. "Inner diameter" refers to a diameter from the central axis to the inner area of the magnet. "Outer diameter" refers to a diameter from the central axis to the outer area of the magnet.

In another embodiment, the one or more permanent ring magnets of the permanent magnet lens can include a first ring magnet having a first diameter and a second ring magnet having a second diameter, the first and second ring magnets being concentric around a central axis of the permanent magnet lens, the first diameter less than the second diameter, the first ring magnet having a magnetic excitation higher than a magnetic excitation of the second ring magnet.

In some embodiments, the magnetic field conductor of the permanent magnet lens forms a pole piece that extends through a center hole of the one or more permanent ring magnets and which protrudes lower than a bottom area of the one or more permanent ring magnets. The "center hole" of the magnets is the area between the lens axis and the inner area of the magnet.

Figure 4:
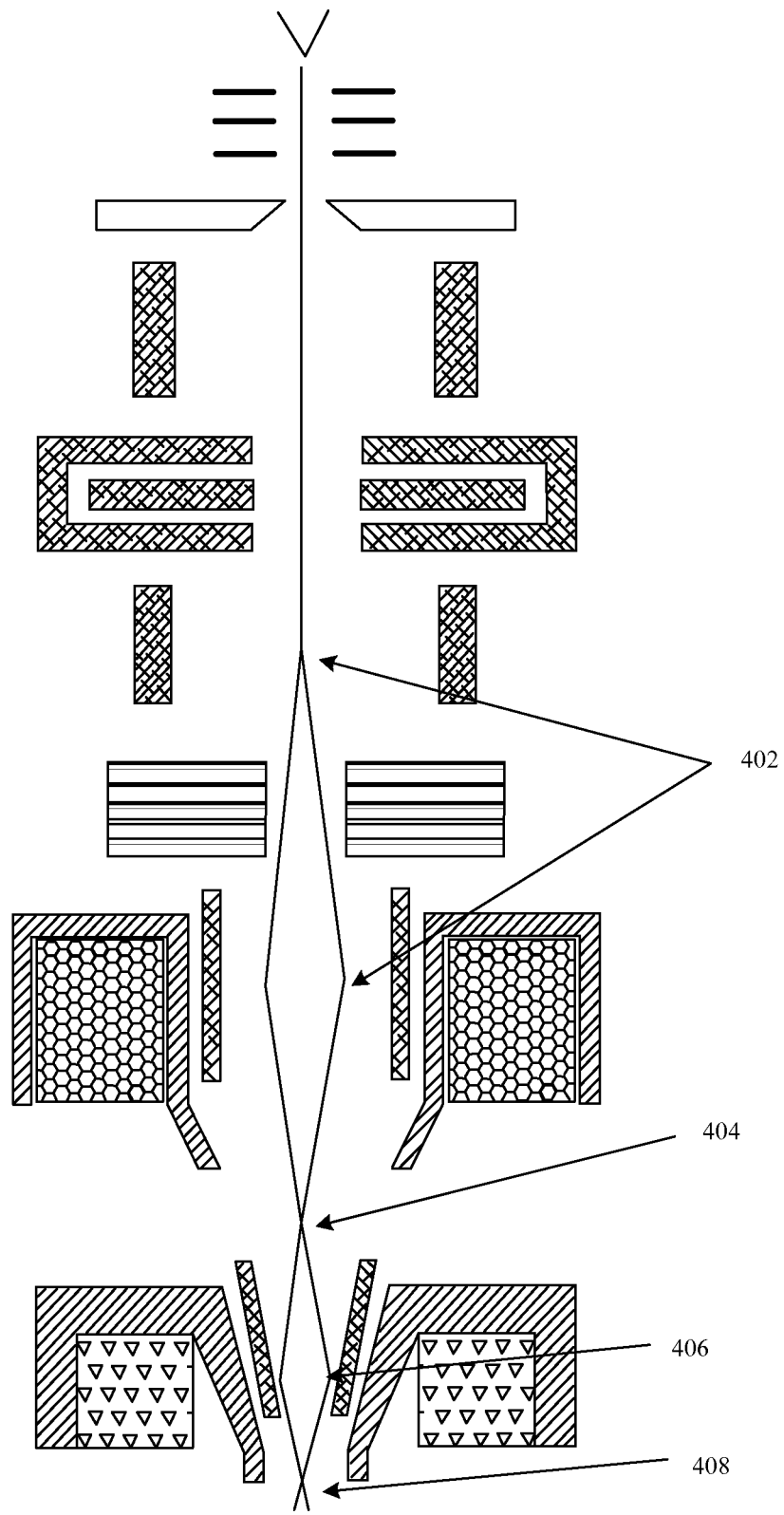
FIG. 4 illustrates an embodiment of a triple deflection scanning electron beam column.

FIG. 4 illustrates an embodiment of a triple deflection electron scan column. Two deflectors 112,120 cooperate to scan the electron beam through the center 404 of the magnetic adjustment lens 116. A third deflector 122 isolated between the permanent magnet lens 118 and the magnetic adjustment lens 116 scans the electron beam through the center 408 of the permanent magnet lens 118. The third deflector 122 (e.g., electrostatic octu-pole or duodeca-pole) may also operate as/include a stigmator. The triple deflection column has a superior field of view than a double deflection column, because the first two deflectors 112,120 scan through the center of the magnetic adjustment lens 116 to minimize off axis aberration, and the third scan deflector 122 scans through the center of the permanent magnet lens 118.

Figure 5:
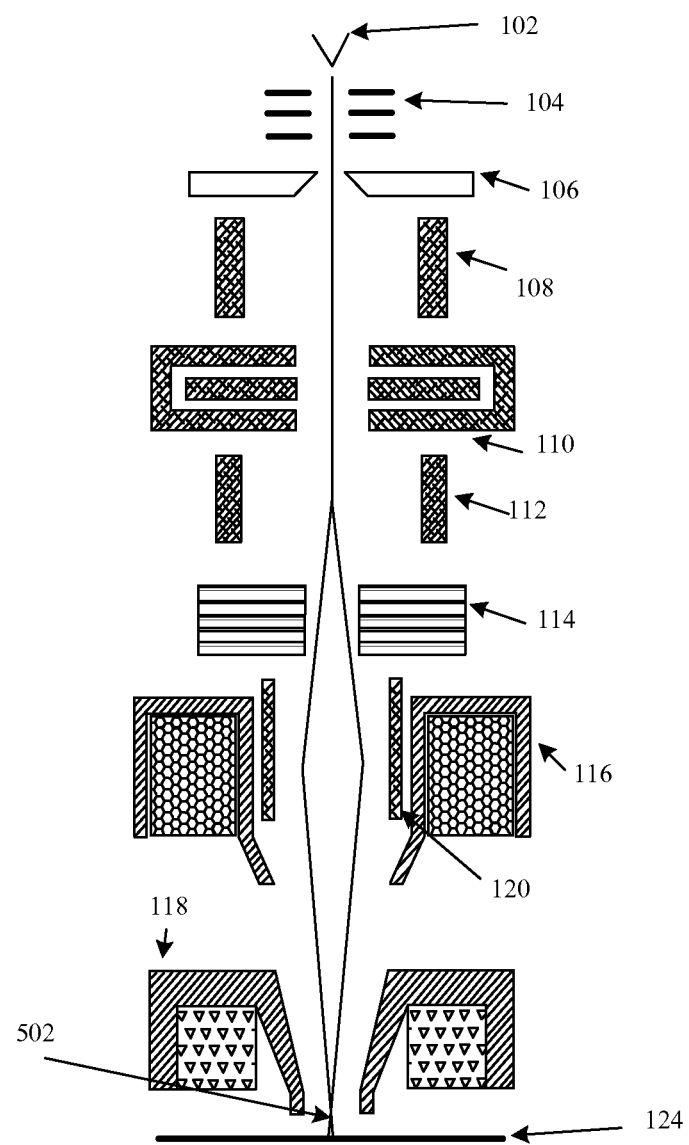
FIG. 5 illustrates an embodiment of a double deflection scanning electron beam column.

FIG. 5 illustrates an embodiment of a double deflection electron scan column. The two deflectors 112,120 cooperate to scan the electron beam through the center 502 of the permanent magnet lens 118. There is no third deflector 122 co-located with the permanent magnet lens 118.

Figure 6:
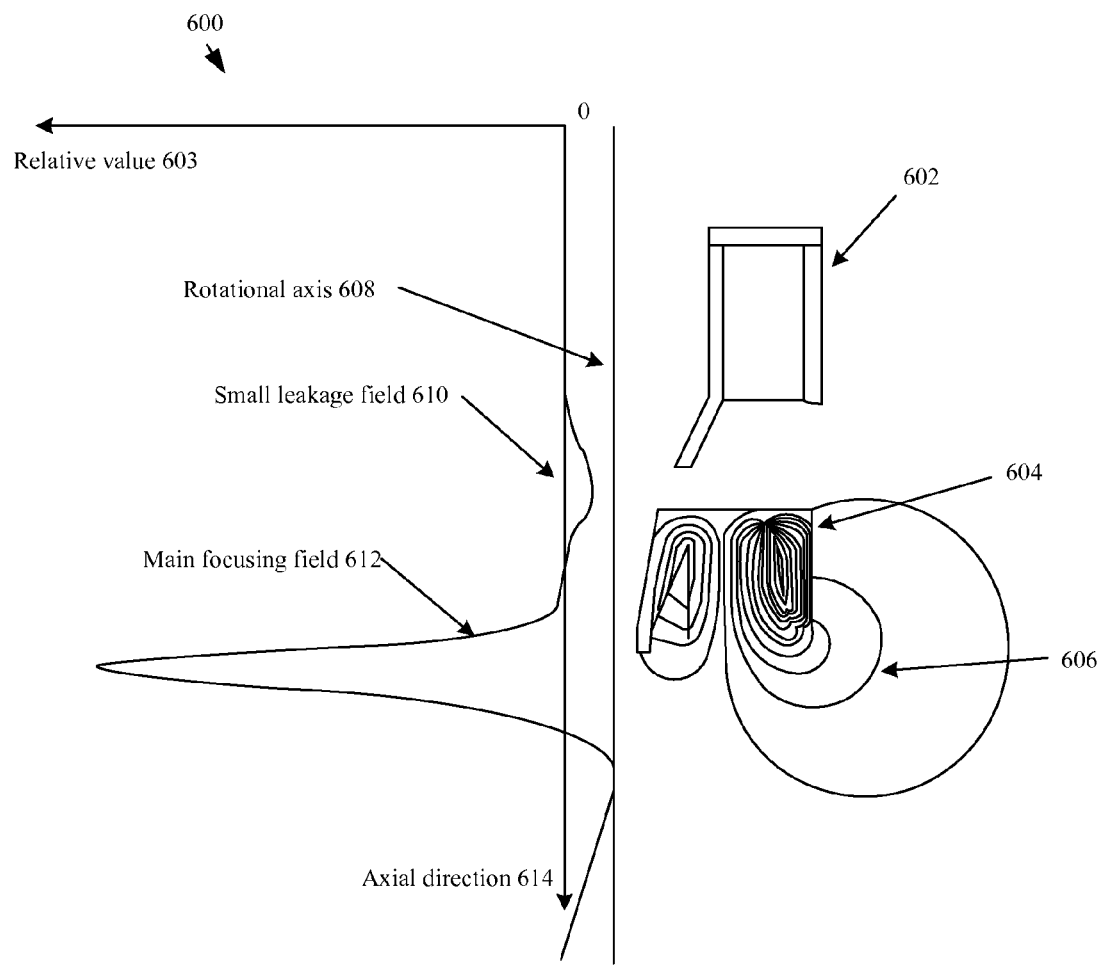
FIG. 6 illustrates an example of an axial magnetic field distribution with the magnetic adjustment lens coil current set to 0.

FIG. 6 illustrates an example of an axial magnetic field distribution with the magnetic adjustment lens coil current set to zero (0). The axial magnetic field 600 relative value 603 is shown as distributed along an axial direction 614 of a rotational axis 608 of the magnetic adjustment lens 602 and permanent magnet lens 604. Magnetic flux 606 of the permanent magnet lens 604 produces a main focusing field 612 having peak value below the permanent magnet lens 604, where the sample is located. A small leakage field 610 is evident when the magnetic adjustment lens current is set to zero (0).

The magnetic flux 606 extends below the permanent magnet lens, and axial magnetic field distribution peaks below the permanent magnet lens, allowing the sample to be immersed in the magnetic field to obtain higher resolution and larger field of view.

Figure 7:
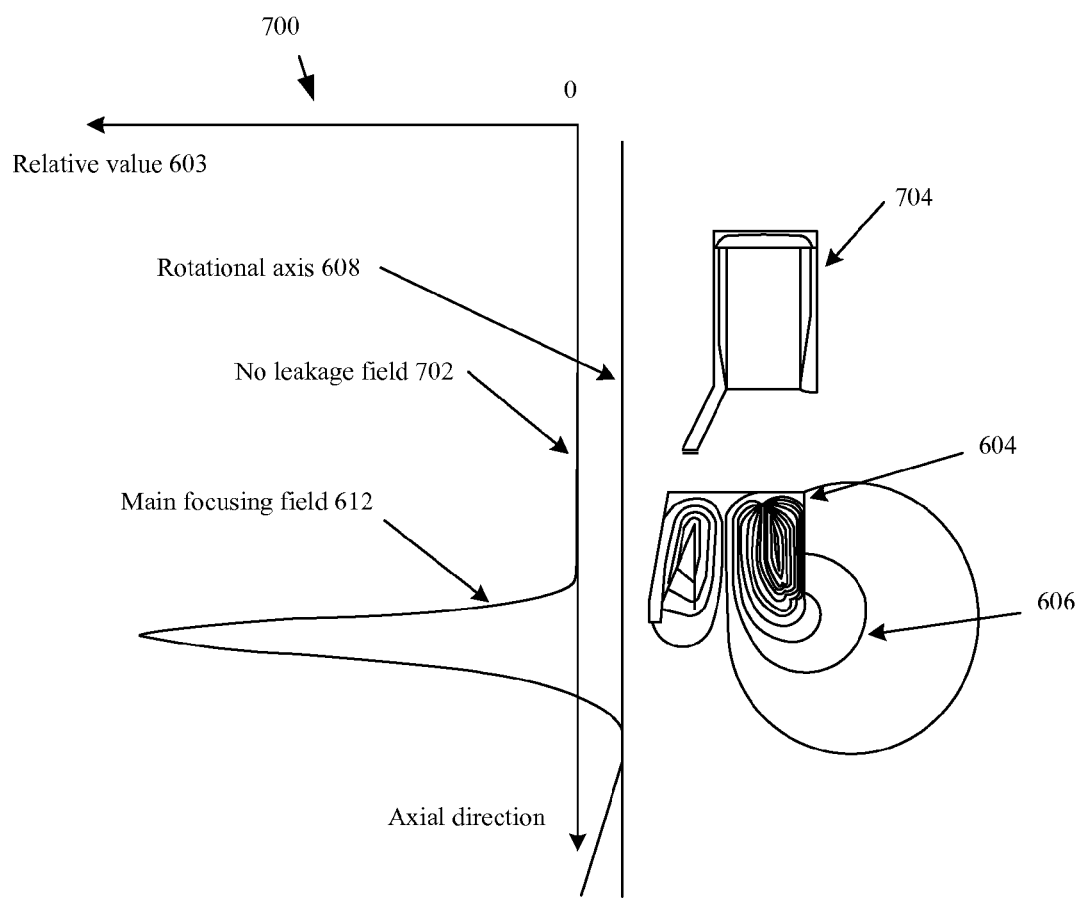
FIG. 7 illustrates an example of an axial magnetic field distribution with the magnetic adjustment lens coil current set to cancel all axial field leakage.

FIG. 7 illustrates an example of an axial magnetic field distribution with the magnetic adjustment lens coil current set to cancel axial field leakage. A current in the magnetic adjustment lens coil counteracts any leakage field produced by the permanent magnet lens flux 606, resulting in no leakage field effect 702.

Figure 8:
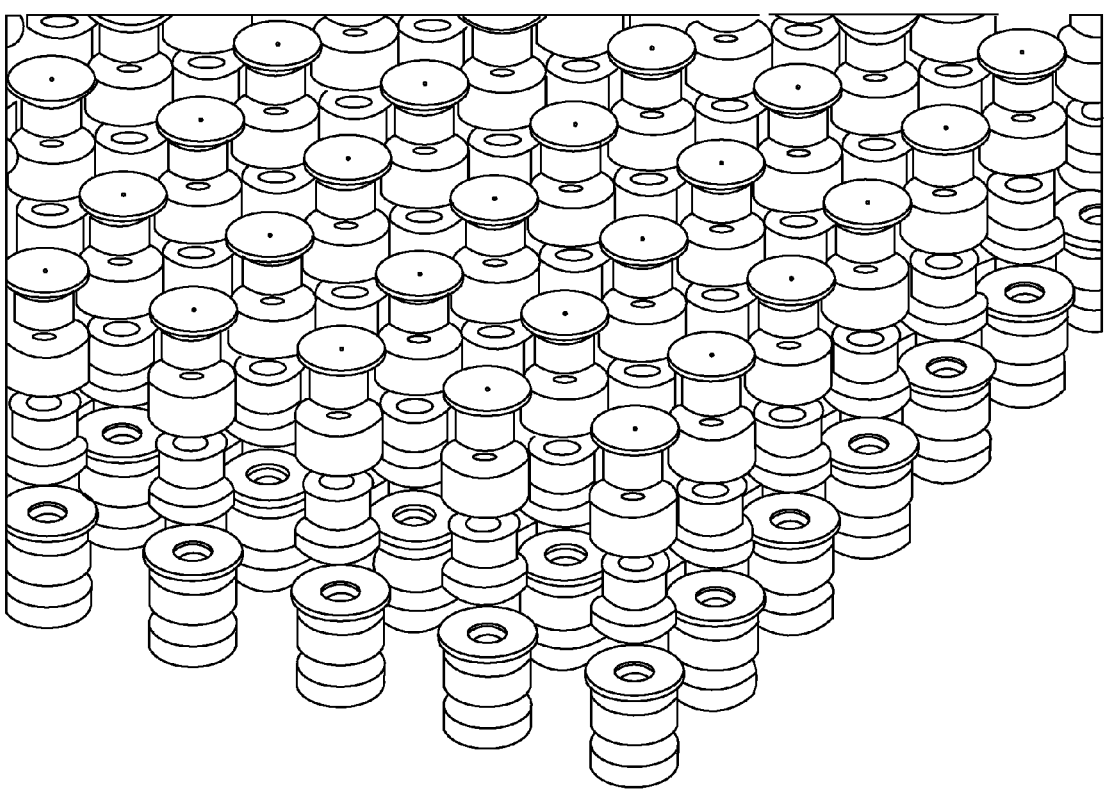
FIG. 8 illustrates an example of lenses and scanning components array arrangement.

FIG. 8 illustrates an example lens and column array arrangement. The axially compact design of each column and the electrical and magnetic isolation between each column enables the construction of dense arrays. Each column has rotational symmetry, and each column utilizes magnetic excitation and magnetic conducting material separate from any other column, providing excellent local symmetry when columns are assembled into an array. For each column, the magnetic field peaks below the permanent magnet lens, reducing interference between neighboring columns/lenses. There is no shared or joint functional part between different columns, providing flexibility as to the relative arrangement of the columns (e.g., the x and/or y distance may be varied between columns for different applications). Arrays may be assembled in which the columns are at equal or unequal varying distances between one another. If the columns are assembled into an equally spaced array, local field distribution maintains a two-fold symmetry. Shielding lenses may be installed around array elements to further improve the two-fold symmetry of the array.

An array of scanning columns may include anywhere from one column up to any number, arranged in varying layouts including but not limited to square, rectangular and circular layouts.

IMPLEMENTATIONS AND ALTERNATIVES

Those skilled in the art will recognize that it is common within the art to describe devices and/or processes in the fashion set forth herein, and thereafter use standard engineering practices to integrate such described devices and/or processes into larger systems.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

What is claimed is:

1. An apparatus, comprising:
   a magnetic adjustment lens, which is excited by an electric coil, positioned along an electron beam path between an electron source and a sample to be scanned by an electron beam in the electron beam path;
   a permanent magnet lens positioned directly below the magnetic adjustment lens to focus the electron beam onto the sample to be scanned, the permanent magnet lens excited by one or more permanent ring magnet enclosed except on a bottom surface of the permanent ring magnet by a permanent magnet lens magnetic field conductor; and
   the magnetic adjustment lens adapted to emit a high magnetic leakage field relative to a magnetic leakage field produced by the permanent magnet lens above the permanent magnet lens, the magnetic adjustment lens positioned relative to the permanent magnet lens such that the high magnetic leakage field is emitted when the electric coil is excited and interferes to substantially eliminate the magnetic leakage field produced by the permanent magnet lens above the permanent magnet lens.

2. The apparatus of claim 1, the permanent ring magnet of the permanent magnet lens comprising a first ring magnet having a first ring magnet height and a first ring magnet diameter, and a second ring magnet having a second ring magnet height and a second ring magnet diameter, the first ring magnet and the second ring magnet being concentric around a central axis of the permanent magnet lens, the first ring magnet height greater than the second ring magnet height, the first ring magnet diameter less than the second ring magnet diameter.

3. The apparatus of claim 1, the permanent magnet lens magnetic field conductor comprising a first magnetic field conductor material having a first magnetic permeability, and a second magnetic field conductor material having a second magnetic permeability, the first magnetic permeability greater than the second magnetic permeability, the first magnetic field conductor material configured to shield at least a part of a top area of the permanent ring magnet and all of an inner area of the permanent ring magnet, and the second magnetic field conductor material configured to shield at least a part of the top area of the permanent ring magnet and all of an outer area of the permanent ring magnet.

4. The apparatus of claim 1, the permanent ring magnet having a permanent ring magnet cross section height that is greater at an inner diameter of the permanent ring magnet than at an outer diameter of the permanent ring magnet.

5. The apparatus of claim 1, the permanent ring magnet of the permanent magnet lens comprising a first ring magnet having a first ring magnet diameter and a second ring magnet having a second ring magnet diameter, the first ring magnet and the second ring magnet being concentric around a central axis of the permanent magnet lens, the first ring magnet diameter less than the second ring magnet diameter, the first ring magnet having a first ring magnet magnetic excitation higher than a second ring magnet magnetic excitation of the second ring magnet.

6. The apparatus of claim 1, the permanent magnet lens magnetic field conductor forming a pole piece that extends through a center hole of the permanent ring magnet and which protrudes lower than a bottom area of the permanent ring magnet.

7. The apparatus of claim 1, further comprising:
   an electrostatic adjustment lens positioned to change a focus of the electron beam at the sample to be scanned, the electrostatic adjustment lens having an electrostatic adjustment lens excitation; and
   the permanent magnet lens positioned to receive the electron beam from the electrostatic adjustment lens.

8. The apparatus of claim 1, wherein an octu-pole stigmator and deflector is located in proximity to the permanent magnet lens magnetic field conductor.

9. The apparatus of claim 1, wherein a duodeca-pole stigmator and deflector is located in proximity to the permanent magnet lens magnetic field conductor.

10. The apparatus of claim 1, wherein an octu-pole stigmator and deflector is located in proximity to a magnetic adjustment lens magnetic field conductor of the magnetic adjustment lens.

11. The apparatus of claim 1, a duodeca-pole stigmator and deflector is located in proximity to a magnetic adjustment lens magnetic field conductor.

12. The apparatus of claim 1, further comprising:
the magnetic adjustment lens and the permanent magnet lens are configured without intervening electrical isolation from a scanning electron beam deflector.

13. The apparatus of claim 1, further comprising:
the magnetic adjustment lens and the permanent magnet lens are configured with intervening high-voltage electrical isolation from a scanning electron beam deflector.

14. The apparatus of claim 1, the magnetic adjustment lens configured to generate overlapping electrostatic and magnetic fields.

15. The apparatus of claim 1, the magnetic adjustment lens located within 10 mm of the permanent magnet lens.

16. The apparatus of claim 1, the magnetic adjustment lens configured to eliminate magnetic field leakage of the permanent magnet lens.

17. The apparatus of claim 1, an electrostatic adjustment lens configured to change a depth of focus of the focused electron beam on the sample.

18. The apparatus of claim 1, the permanent magnet lens configured to control a focus of the electron beam by controlling a voltage bias of the permanent magnet lens.

* * * * *